(12) United States Patent
Baumann et al.

(10) Patent No.: US 6,489,688 B1
(45) Date of Patent: Dec. 3, 2002

(54) AREA EFFICIENT BOND PAD PLACEMENT

(75) Inventors: Doug Baumann, San Jose, CA (US); Louis Pandula, Sunnyvale, CA (US)

(73) Assignee: ZeeVo, Inc., Santa Clara, CA (US)

( * ) Notice: Subject to any disclaimer, the term of this patent is extended or adjusted under 35 U.S.C. 154(b) by 0 days.

(21) Appl. No.: 09/847,948

(22) Filed: May 2, 2001

(51) Int. Cl.[7] .................. H01L 23/48; H01L 23/52; H01L 29/40
(52) U.S. Cl. .................. 257/786; 257/691; 257/778; 438/612; 438/666
(58) Field of Search .................. 257/666, 691, 257/778, 202, 203, 503, 773, 776, 786, 909; 438/108, 128, 129, 612, 666

(56) References Cited

U.S. PATENT DOCUMENTS

| | | | | |
|---|---|---|---|---|
| 5,216,280 A | * | 6/1993 | Tanaka et al. | 257/503 |
| 5,512,765 A | * | 4/1996 | Gaverick | 257/202 |
| 5,581,109 A | * | 12/1996 | Hayashi et al. | 257/203 |
| 5,610,417 A | * | 3/1997 | Doi | 257/202 |
| 5,641,978 A | * | 6/1997 | Jassowski | 257/203 |
| 6,093,942 A | * | 7/2000 | Sei et al. | 257/203 |
| 6,144,100 A | * | 11/2000 | Shen et al. | 257/762 |

* cited by examiner

Primary Examiner—David Nelms
Assistant Examiner—Andy Huynh
(74) Attorney, Agent, or Firm—Townsend and Townsend and Crew LLP

(57) ABSTRACT

Embodiments of the present invention provide flip-chip bond pad arrangements that lead to a smaller increase in die size than conventional approaches. This is accomplished by using the core side of a periphery I/O pad ring for placing some of the bond pads in order to meet the bond pad pitch requirements of flip chip technology. For example, alternating bond pads are moved inward to the core side of the I/O pads or drivers, to meet the bond pad pitch requirement between the bond pads that are moved to the core side as well the bond pads that remain outside of the core. Because the bond pads are moved inward instead of outward, the increase in the die size from the edge of the I/O pad ring is reduced. In an alternative embodiment, the bond pads are each bonded on top of an active circuitry of a corresponding I/O pad. In another alternative embodiment, the bond pads are disposed between I/O pads which are spaced from each other by a spacing in the direction of the periphery of the core to accommodate the bond pads.

19 Claims, 3 Drawing Sheets

AREA EFFICIENT BOND PAD PLACEMENT

BACKGROUND OF THE INVENTION

The present invention relates generally to packaging of semiconductor devices and, more particularly, to bond pad placement for flip chip packages.

Flip chip technology provides many benefits over traditional wire bonding technologies including reduced electrical parasitics and reduced complexity in manufacturing. However, the requirements for bond pad placement for flip-chip is more stringent than for wire bonding. In particular, the pitch between bond pads for flip chip must be substantially greater than wire bond pad pitch. As shown in FIG. 1a, the pitch of bond pads 10 that meets wire bonding technology rules is too small to meet flip-chip technology requirements 12 (e.g., 300 $\mu$m). This can lead to larger die sizes for the flip chip, especially for pad-limited designs where the die area is governed by the number and size of the I/O pads 16.

Prior solutions include moving alternating bond pads further away from I/O drivers or pads 16 until the minimum bond pad spacing requirements are met, as illustrated in FIG. 1b. This approach increases the die size. For example, in the flip chip technology where the bond pad pitch requirement is 300 $\mu$m, the traditional approach would be to move alternating bond pads out approximately (300 $\mu$m+bond pad height) per side.

To illustrate the die size increase, consider a chip with periphery I/O drivers which is 5000 $\mu$m per side (excluding bond pads), with a bond pad which is 80 $\mu$m in height, and which is to use flip chip package technology. Using prior techniques, there will be two rows of bond pads around the chip. The first row will be placed closest to the periphery I/O drivers, and the second row will be approximately 300 $\mu$m further from the I/O drivers. This leads to a die size of approximately, (5000 $\mu$m+80 $\mu$m (bond pad height)+300 $\mu$m)$^2$, which is 5380 $\mu$m per side. This bond pad placement is inefficient since there is substantial "wasted" area around the periphery of the die.

BRIEF SUMMARY OF THE INVENTION

Embodiments of the present invention provide flip-chip bond pad arrangements that lead to a smaller increase in die size than conventional approaches. This is accomplished by using the core side of the I/O pad ring for placing some of the bond pads in order to meet the bond pad pitch requirements of flip chip technology. For example, alternating bond pads are moved inward to the core side of the I/O pads or drivers, to meet the bond pad pitch requirement between the bond pads that are moved to the core side as well the bond pads that remain outside of the core. Because the bond pads are moved inward instead of outward, the increase in the die size from the edge of the I/O pad ring is reduced.

In accordance with an aspect of the present invention, an integrated circuit device comprises a plurality of I/O pads disposed along a periphery of a core. The core has no I/O pads disposed therein. A plurality of bond pads are provided for the I/O pads. A portion of the bond pads are disposed inside the core and a remaining portion of the bond pads are disposed outside of the core.

In some embodiments, the bond pads are spaced from each other by a minimum bond pad pitch. The minimum bond pad pitch between bond pads is 300 $\mu$m. Each bond pad is disposed adjacent a corresponding I/O pad. Alternating bond pads are disposed inside the core and remaining alternating bond pads are disposed outside of the core. The I/O pads are oriented transverse to the periphery of the core.

In accordance with another aspect of the present invention, an integrated circuit device comprises a plurality of I/O pads disposed and oriented along a periphery of a core. A plurality of bond pads are provided for the I/O pads. Each bond pad is bonded on top of an active circuitry of a corresponding I/O pad. The bond pads are spaced along the periphery of the core by a minimum bond pad pitch.

In specific embodiments, the minimum bond pad pitch may be 300 $\mu$m. Each bond pad has a bond pad height which matches a height of the corresponding I/O pad to which the bond pad is bonded. A plurality of power buses extend along the I/O pads parallel to the periphery of the core. The core has no I/O pads disposed therein.

In some embodiments, the plurality of I/O pads are arranged into a plurality of rows of I/O pad rings around the periphery of the core. In one embodiment, a plurality of power buses extend along the I/O pad rings parallel to the periphery of the core. In another embodiment, a plurality of power buses extending across the I/O pad rings and across the core. The power buses provide power to both the core and the I/O pads.

In accordance with another aspect of the invention, an integrated circuit device comprises a plurality of I/O pads disposed along and oriented transverse to a periphery of a core. The I/O pads are spaced from each other by spacings in a direction along the periphery of the core. A plurality of bond pads are provided for the I/O pads. The bond pads are disposed in the spacings between the I/O pads.

In specific embodiments, the I/O pads and bond pads are alternately disposed along the periphery of the core. The bond pads are spaced from each other by a minimum bond pad pitch. The minimum bond pad pitch is 300 $\mu$m. The core has no I/O pads disposed therein.

DESCRIPTION OF THE SPECIFIC EMBODIMENTS

Figure 2:
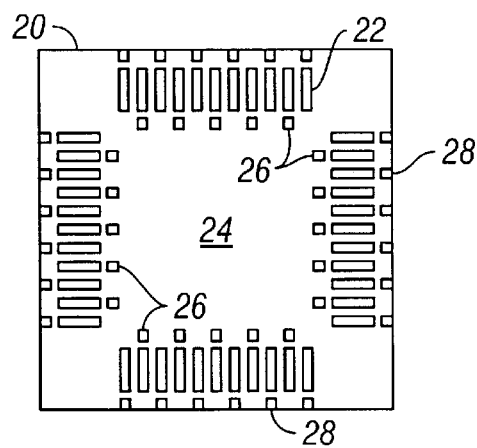
FIG. 2 is a top plan view schematically illustrating a die with bond pads arranged for flip chip according to an embodiment of the present invention.

FIG. 2 shows a die 20 having periphery I/O pads 22 arranged to form a "ring" around a core 24. The periphery I/O pad arrangement is typically used for a pad-limited design where the chip design is constrained by the number and size of the I/O pads 22. In this flip-chip bond pad arrangement, a portion of the bond pads are placed on the core side of the I/O pad or driver ring 22 in order to meet the bond pad pitch requirements of flip chip technology. In the specific embodiment shown, alternating bond pads 26 are moved to the core side of the I/O pads or drivers 22, while the remaining bond pads 28 are left outside of the I/O pad ring.

As shown in FIG. 2, there are two rows of bond pads 26, 28. The first row of bond pads 26 are disposed just inside the I/O driver ring 22, and the second row of bond pads 28 are disposed just outside the I/O driver ring 22. Because the bond pads 26 are moved inward instead of outward, the increase in the die size is reduced. For a chip which is 5000 $\mu$m per side (excluding bond pads) with a bond pad which is 80 $\mu$m in height, this leads to a die size of (5000 $\mu$m+80 $\mu$m (inner bond pad row)+80 $\mu$m (outer bond pad row))$^2$, or 5160 $\mu$m per side. Compared to bond pad arrangements using prior approaches (requiring 5380 $\mu$m per side), this represents a decrease in silicon area of about 8.7% silicon area.

It is noted that if flip chip technology advances so that the minimum pitch between pads is reduced to 16 $\mu$m, then the alternate placement of the bond pads inside and outside the I/O driver ring 22 would enable the use of flip chip without any additional processing steps. The flip chip bond pad pitch is currently at 250 $\mu$m from a specific vendor. The I/O pads are typically 40 $\mu$m wide and 250 $\mu$m tall (for 0.18 $\mu$m process at the TSMC fabrication facility). In order to meet the 250 $\mu$m bond pad pitch for flip chip, there are several post-fabrication manufactures which deposit a "redistribution" layer. This redistribution layer is superimposed on top of the manufactured die in such a way that the 250 $\mu$m bond pad pitch requirement is met without intruding into the available metal layers used at the fabrication facility. If, at some point in the future, the pitch requirement is relaxed to 160 $\mu$m, the redistribution could be accomplished at the fabrication facility simply by alternating the bond pads outside and inside the I/O pad ring, without the need to deposit a redistribution layer.

Other embodiments of the present invention employ a design with I/O height and bond pad height matching, bond pad in I/O ring, and the like. Each approach has certain benefits and possible drawbacks.

Figure 3:
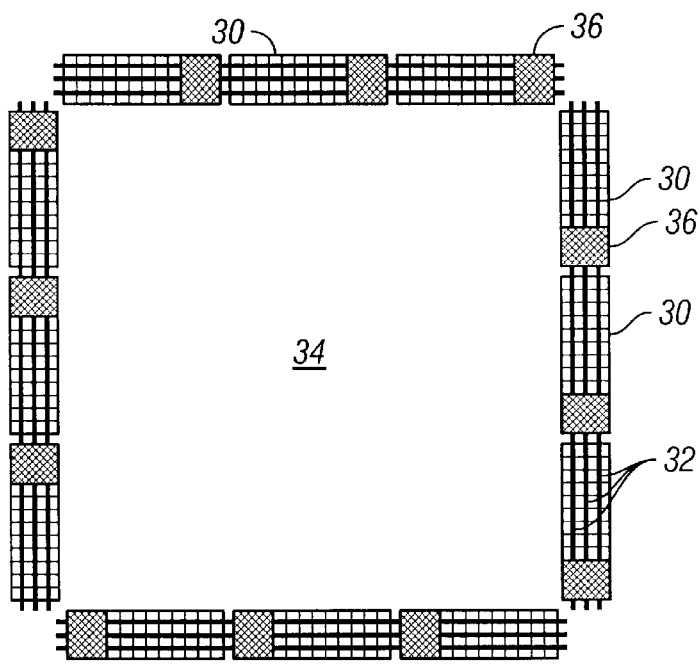
FIG. 3 is a top plan view schematically illustrating a die with bond pads arranged for flip chip according to another embodiment of the present invention.
Figure 4:
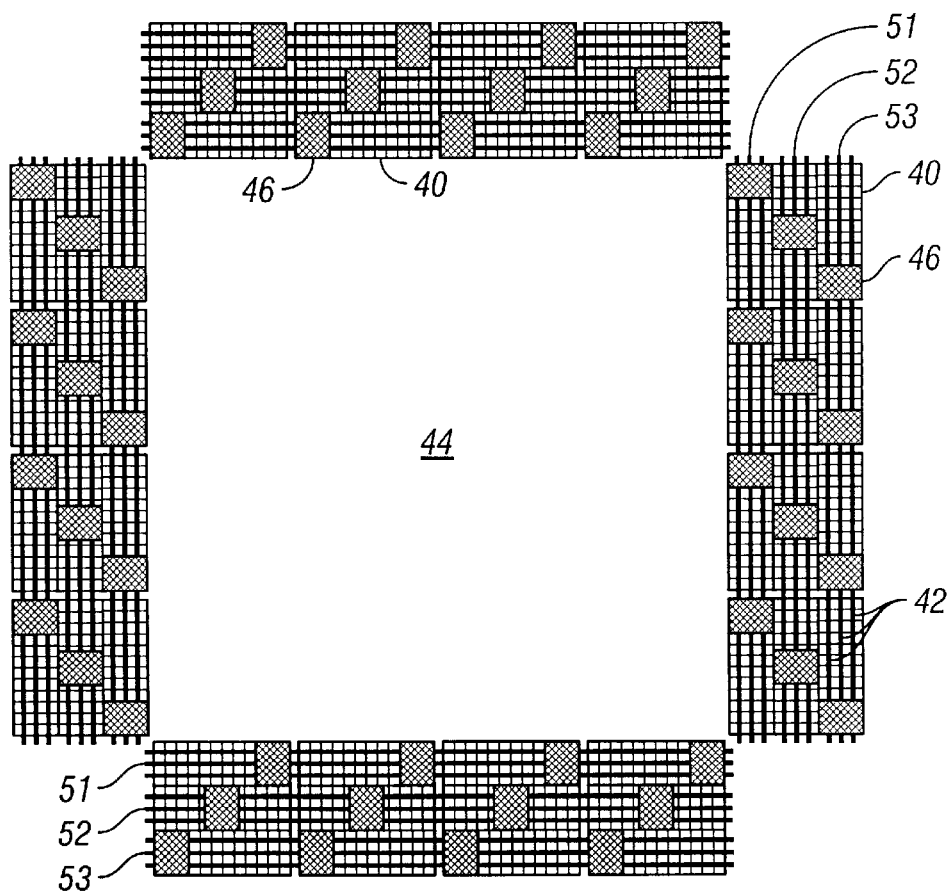
FIG. 4 is a top plan view schematically illustrating a die with bond pads arranged for flip chip according to another embodiment of the present invention.
Figure 5:
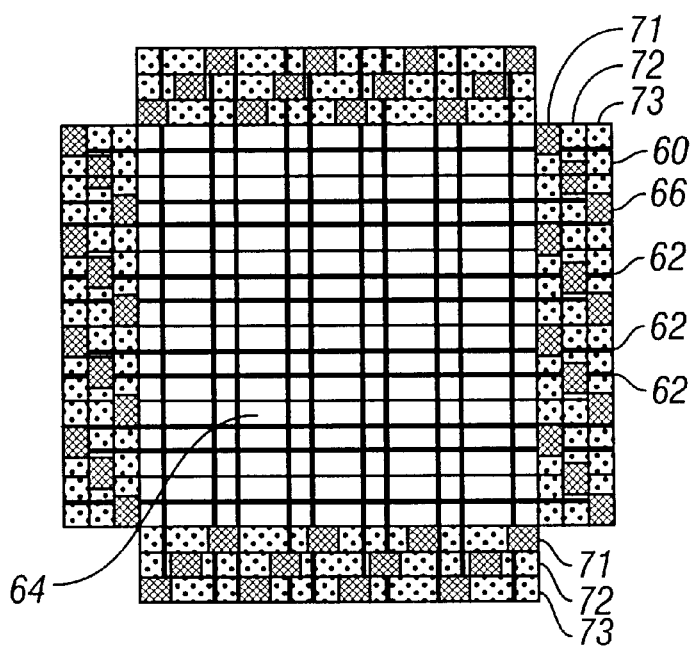
FIG. 5 is a top plan view schematically illustrating a die with bond pads arranged for flip chip according to another embodiment of the present invention.

FIGS. 3–5 illustrate some specific examples of layouts which provide I/O height and bond pad height matching where the I/O drivers are drawn so that the height of the I/O driver is the same as the height of the bond pad. This technique affords several possibilities if bonding is allowed on top of active circuitry.

In FIG. 3, the I/O driver circuitry is drawn such that each I/O pad 30 is lying on its side with the power buses 32 oriented parallel to the I/O pads 30 extending along the periphery of the core 34. The I/O power ring of pads 30 is similar to conventionally drawn I/O pads. This configuration of the I/O ring is used in the case of a core-limited or highly core-limited design where the chip design is constrained by the size of the core 34 instead of the number and size of the I/O pads 30, so that there is a lot of room available for placement and arranged of the I/O pads 30 around the core 34. The bond pads 36 are spaced along the I/O ring 30 and bonded on top of the active circuitry (e.g., top metal layer) of the I/O pads 30, with matching I/O pad height and bond pad height.

A possible drawback is that the I/O ring power buses 32 may be limited in width and number due to the limited height of the I/O ring. As shown in the example of FIG. 3, the 3 power buses 32 (which may be VDDIO, VDDCORE and VSSCOMMON) must be drawn to fit into the height of the bond pad 36.

In FIG. 4, I/O rings 40 and bond pads 46 similar to those shown in FIG. 3 are stacked around the periphery of the core 44. FIG. 4 shows three rows 51, 52, 53 of stacked I/O rings 40 overlaid with bond pads 46. The power buses 42 are parallel to the direction of the I/O pads 40. The placement of the bond pads 46 are selected to meet the bond pad pitch requirement of 300 $\mu$m. Due to the increase in I/O pads 40, the stacked configuration may be used to accommodate less core-limited designs, or even pad limited designs.

FIG. 5 shows stacked I/O rings 60 and bond pads 66 similar to those shown in FIG. 4, except that the power buses 62 are orthogonal to the direction of the I/O pads 60, and not parallel to the periphery of the core 64. This layout lends itself well to power-grid types of layout since the power buses 62 always intersect with the core region 64 of the chip. Power is shared between the core 64 and the I/O pads 60. An advantage is that the power buses 62 can be more numerous, or wider than with the layouts in FIGS. 3 and 4. Another advantage is that the distribution of the power grid provides generally lower resistive paths to the transistor devices in the I/O drivers 60 and in the core region 64. Another advantage is that in pad-limited designs using flip-chip, the configuration in FIG. 5 provides the freedom to stack the I/O pads 60 as deep as needed to save die area with high I/O pad densities. FIG. 5 shows three rows 71, 72, 73 of stacked I/O pads 60. For extremely pad-limited designs, the number of rows can be increased to 5, 7, and beyond, as long as the layout meets the flip-chip bond pad separation requirements. The configuration of FIG. 5 is more suitable for a design in which the I/O power is connected with the core voltage. If the I/O power is completely separate from the core voltage, a lot of metal will be used in the core regions 64 to form the power grid layout which would not otherwise have been used.

Figure 1A:
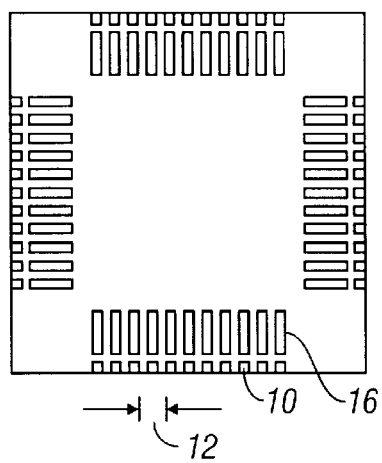
FIG. 1a is a top plan view schematically illustrating a die with bond pads arranged for wire bonding.
Figure 1B:
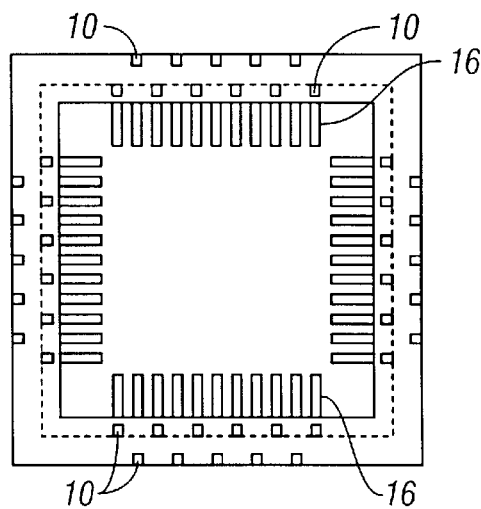
FIG. 1b is a top plan view schematically illustrating a die with bond pads arranged for flip chip using a conventional approach.
Figure 6:
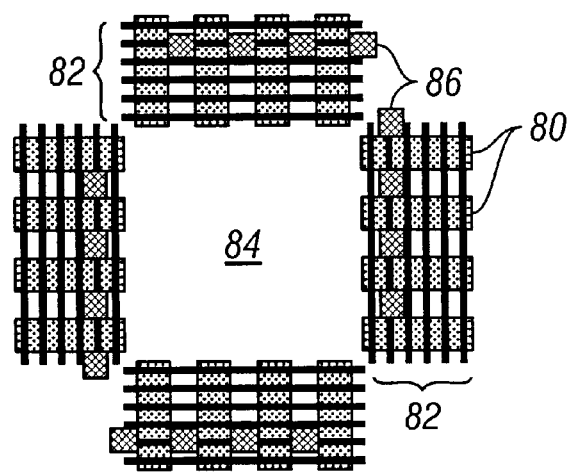
FIG. 6 is a top plan view schematically illustrating a die with bond pads arranged for flip chip according to another embodiment of the present invention.

Another approach provides bond pad in I/O ring by moving the bond pads from the area outside the traditional I/O ring to the I/O ring area. The main advantage is the reduction in die area previously occupied by the bond pads. FIG. 6 shows bond pads 86 being placed in spacings between I/O pads 80 which are oriented transverse to the periphery of the core 84 in a manner similar to that shown in FIGS. 1 and 2. The power buses 82 extend along the periphery of the core 84 and across the I/O pads 80. The spacing of the I/O pads 80 from each other is suitable for core-limited designs.

The design has some possible drawbacks. The bond pads 86 will not be able to be comprised of all layers of available metal, although it will not be over active circuitry (as in FIGS. 3–5). Because the bond pad must use at least the top layer of metal, if these bond pads are located in the power ring of the I/O pad ring, at least the top layer metal cannot be used for routing power in the I/O pad ring or else the bond pads would be shorted to the top layer metal I/O power rings. The design is most useful only in cases where the chip is substantially core-limited to accommodate the increase in width of the combination of bond pad 86 and I/O driver 80 along the periphery of the core 84.

The above-described arrangements of apparatus and methods are merely illustrative of applications of the principles of this invention and many other embodiments and modifications may be made without departing from the spirit and scope of the invention as defined in the claims. For example, the specific spacings and locations of the bond pads, I/O pads, and power buses in each of the configurations shown may be changed. The bond pad placement can be applied to packages other than flip chip packages. The scope of the invention should, therefore, be determined not with reference to the above description, but instead should be determined with reference to the appended claims along with their full scope of equivalents.

What is claimed is:

1. An integrated circuit device comprising:

a plurality of I/O pads disposed and oriented along a periphery of a core; and a plurality of bond pads for the I/O pads, each bond pad being bonded on top of an active circuitry of a corresponding I/O pad, the bond pads being spaced along the periphery of the core by a minimum bond pad pitch, wherein each bond pad has a bond pad height which matches a height of the corresponding I/O pad to which the bond pad is bonded.

2. The device of claim 1 wherein the minimum bond pad pitch is 300 μm.

3. The device of claim 1 further comprising a plurality of power buses extending along the I/O pads parallel to the periphery of the core and to the I/O pads.

4. The device of claim 1 wherein the plurality of I/O pads are arranged into a plurality of rows of I/O pad rings around the periphery of the core.

5. The device of claim 4 further comprising a plurality of power buses extending along the I/O pad rings parallel to the periphery of the core and to the I/O pads.

6. The device of claim 4 further comprising a plurality of power buses extending across the I/O pad rings and across the core.

7. The device of claim 6 wherein the power buses provide power to both the core and the I/O pads.

8. An integrated circuit device comprising:

a plurality of I/O pads disposed and oriented along a periphery of a core;

a plurality of bond pads for the I/O pads, each bond pad being bonded on top of an active circuitry of a corresponding I/O pad, the bond pads being spaced along the periphery of the core by a minimum bond pad pitch; and a plurality of power buses extending along the I/O pads parallel to the periphery of the core and to the I/O pads.

9. The device of claim 8 wherein the minimum bond pad pitch is 300 μm.

10. An integrated circuit device comprising:

a plurality of I/O pads disposed and oriented along a periphery of a core; and a plurality of bond pads for the I/O pads, each bond pad being bonded on top of an active circuitry of a corresponding I/O pad, the bond pads being spaced along the periphery of the core by a minimum bond pad pitch, wherein the plurality of I/O pads are arranged into a plurality of rows of I/O pad rings around the periphery of the core.

11. The device of claim 10 further comprising a plurality of power buses extending along the I/O pad rings parallel to the periphery of the core and to the I/O pads.

12. The device of claim 10 further comprising a plurality of power buses extending across the I/O pad rings and across the core.

13. The device of claim 12 wherein the power buses provide power to both the core and the I/O pads.

14. The device of claim 10 wherein the minimum bond pad pitch is 300 μm.

15. An integrated circuit device comprising:

a plurality of I/O pads disposed along and oriented transverse to a periphery of a core, the I/O pads being spaced from each other by spacings in a direction along the periphery of the core; and a plurality of bond pads for the I/O pads, the bond pads being distributed along the periphery of the core and being disposed in the spacings between the I/O pads.

16. The device of claim 15 wherein the I/O pads and bond pads are alternately disposed along the periphery of the core.

17. The device of claim 15 wherein the bond pads are spaced from each other by a minimum bond pad pitch.

18. The device of claim 17 wherein the minimum bond pad pitch is 300 μm.

19. The device of claim 15 wherein the core has no I/O pads disposed therein.

* * * * *